(12) United States Patent
Williams et al.

(10) Patent No.: US 6,377,091 B1
(45) Date of Patent: Apr. 23, 2002

(54) MECHANISM FOR MAINTAINING RELATIVELY CONSTANT GAIN IN A MULTI-COMPONENT APPARATUS

(75) Inventors: Stephen T. Williams, Laurel; Tony L. Caviglia, Marriotsville; John Matsuzaki, Catonsville, all of MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/498,451

(22) Filed: Feb. 4, 2000

(51) Int. Cl.$^7$ .............................. H03L 7/06
(52) U.S. Cl. ..................... 327/156; 327/147
(58) Field of Search ................. 327/147, 148, 327/156, 157; 375/375, 376

(56) References Cited

U.S. PATENT DOCUMENTS

| | | | | |
|---|---|---|---|---|
| 5,126,692 A | * | 6/1992 | Shearer et al. ........... | 331/8 |
| 5,170,130 A | * | 12/1992 | Ichihara .................. | 328/155 |
| 5,475,326 A | * | 12/1995 | Masuda ................... | 327/157 |
| 5,687,201 A | * | 11/1997 | McClellan et al. ....... | 375/374 |
| 5,727,037 A | * | 3/1998 | Maneatis ................. | 375/376 |
| 5,818,304 A | * | 10/1998 | Hogeboom .............. | 331/11 |
| 5,929,677 A | * | 7/1999 | Murata ................... | 327/157 |
| 6,104,771 A | * | 8/2000 | Soda ....................... | 375/376 |

\* cited by examiner

*Primary Examiner*—Toan Tran
*Assistant Examiner*—Quan Tra
(74) *Attorney, Agent, or Firm*—Hickman Palermo Truong & Becker; Bobby K. Truong

(57) ABSTRACT

A gain adjustment circuit for maintaining the overall gain of a multi-component apparatus at a relatively constant level is disclosed. A multi-component apparatus in which the gain adjustment circuit may be implemented includes a first component and a second component. The first component has a variable gain, and receives as input a control signal which determines the gain of the component. The second component has an adjustable gain, and provides as output an output signal which affects the control signal fed to the first component. The gain adjustment circuit adjusts the adjustable gain of the second component based upon the control signal fed to the first component to maintain the overall gain of the components at a relatively constant level. More specifically, if the control signal is at a level which causes the variable gain of the first component to be high, then the gain adjustment circuit sets the adjustable gain of the second component to a low level. On the other hand, if the control signal is at a level which causes the variable gain to be low, then the gain adjustment circuit sets the adjustable gain of the second component to a high level. By doing so, the gain adjustment circuit maintains the overall gain of the components at a relatively constant level. Thus, even though the gains of the individual components may vary greatly, the overall gain of the components does not.

19 Claims, 5 Drawing Sheets

MECHANISM FOR MAINTAINING RELATIVELY CONSTANT GAIN IN A MULTI-COMPONENT APPARATUS

FIELD OF THE INVENTION

This invention relates generally to electronic circuits and more particularly to a mechanism for maintaining relatively constant gain in a multiple component apparatus.

BACKGROUND OF THE INVENTION

A phase-locked loop (PLL) is a mechanism that uses feedback to maintain a specific phase relationship between a reference signal and the output signal of the PLL. The ability of the PLL to maintain this specific phase relationship makes it useful in many different electronic circuit applications, including frequency synthesizers, analog and digital modulators and demodulators, and clock recovery circuits.

A typical PLL is shown in FIG. 1, wherein the PLL 110 comprises a phase frequency detector (PFD) 112, a charge pump 114, a loop filter 116, a voltage controlled oscillator (VCO) 118, and a feedback divider 120. The output of the PLL is taken from the output of the VCO 118, and this output is fed to the feedback divider 120. In response, the feedback divider 120 generates a divided version of the PLL output, and provides the divided version as the feedback signal. The feedback signal and the reference signal are fed as inputs to the PFD 112.

The function of the PFD 112 is to detect the difference in phase and frequency between the two input signals, and to generate output control signals UP and DOWN indicative of the phase and frequency differences. These control signals UP, DOWN are then fed as inputs to the charge pump 114. In response, the charge pump 114 generates a net current in accordance with the input control signals UP, DOWN, to either charge or discharge the loop filter 116 to a particular voltage. It is the voltage on loop filter 116 that controls the frequency of the PLL output generated by the VCO 118. Because of the feedback signal, the voltage present at the input of the VCO 118 is such that it causes the VCO 118 to generate a new PLL feedback signal having a frequency and phase closer to that of the reference signal. In this manner, the PLL 110 "pushes" the phase and frequency of the PLL feedback signal towards that of the reference signal. This feedback/adjustment process continues until the PLL feedback signal "locks on" to the phase and frequency of the reference signal.

The transfer function for the PLL 110 of FIG. 1 is given as follows:

$$H(s) = \frac{K_{cp} K_{vco}(1 + \tau 1 s)}{M(C1 + C2)(1 + \tau 2 s)s^2}$$

where Kcp is the combined gain of the PFD 112 and the charge pump 114;

Kvco is the gain of the VCO 118;

M is the divisor of the feedback divider 120;

C1 and C2 are the values of the capacitors C1 and C2 in the loop filter 116;

τ1=R1C1 where R1 is the value of the resistor R1 in the loop filter 116; and

τ2=τ1C2/(C1+C2).

From this equation, it is clear that the transfer function has one zero (a value of s where the numerator is zero), and three poles (a value of s where the denominator is zero). The zero occurs when s is −1/τ1, and the poles occur when s is 0 (this pole occurs twice since s is squared) and when s is −1/τ2. The transfer function defines the open loop gain of the PLL 110 in the complex s domain.

A plot of the open loop gain of the PLL 110 in the frequency domain is shown in FIG. 2. In FIG. 2, there are three frequencies of note: (1) f1 is the frequency at which the transfer function experiences its zero; (2) f2 is the frequency at which the transfer function experiences its non-zero pole; and (3) fc is the crossover frequency at which the open loop gain of the PLL 110 is unity or 1 (i.e. 0dB). Frequency f1 is equal to 1/(2πτ1) and frequency f2 is equal to 1/(2πτ2). Since f1 and f2 are a function of τ1 and τ2, and since τ1 and τ2 are in turn a function of R1, C1, and C2, f1 and f2 can be set with relative precision by assigning proper values to R1, C1, and C2. From a performance and implementation standpoint, it is desirable to set f1 as high as possible and f2 as low as possible. With a higher f1, smaller on-chip loop filter components can be used, and better phase noise performance is achieved due to higher loop gain. With a lower f2, greater attenuation of reference feed-through is achieved. Thus, to optimize results, the gap between f1 and f2 should be as small as possible.

Several factors limit how close f1 and f2 can be to each other, one of which is stability of the PLL 110. To maintain stability, the unity gain crossover of the PLL 110 needs to occur between f1 and f2 (i.e. fc needs to be between f1 and f2). If the gap between f1 and f2 is small, it requires that the crossover frequency fc be kept within a relatively small frequency band. This can be difficult to do, especially if the gains of the various components in the PLL 110 vary. More specifically, the crossover frequency fc is determined by the overall gain of the PLL 110, which in turn is determined by the gains of the individual components, such as the charge pump 114 and the VCO 118. If the gains of the individual components vary widely, thereby causing the overall gain of the PLL 110 to vary widely, then the crossover frequency will also vary widely. Unfortunately, due to factors such as operating conditions and processing variations, gain variations among the individual components is inevitable. Consequently, the crossover frequency fc currently cannot be determined or set with good precision. As a result, designers have been forced to widen the gap between f1 and f2 to ensure stability. As noted previously, widening the gap between f1 and f2 leads to less than optimal performance.

SUMMARY OF THE INVENTION

To overcome the shortcomings of the prior art, the present invention provides a mechanism for stabilizing the overall gain of a multi-component apparatus, such as a PLL. By maintaining the overall gain of the apparatus at a relatively constant level, the present invention makes it possible to set certain parameters, such as the unity crossover frequency of a PLL, with greater precision. By increasing the precision with which certain parameters may be set, the present invention makes it possible to derive better performance from the apparatus.

In accordance with one embodiment there is provided a gain adjustment circuit for maintaining the overall gain of a multi-component apparatus at a relatively constant level. In one embodiment, the multi-component apparatus in which the gain adjustment circuit may be implemented comprises a first component and a second component. The first component (e.g. a VCO) has a variable gain, and receives as input a control signal which determines the gain of the component. The second component (e.g. a charge pump) has an adjustable gain, and provides as output an output signal which affects the control signal fed to the first component. The gain adjustment circuit adjusts the adjustable gain of the second component based upon the control signal fed to the first component to maintain the overall gain of the components relatively constant. In carrying out this function, the gain adjustment circuit receives the control signal as input and provides an adjustment signal as output.

More specifically, based upon the control signal fed to the first component, the gain adjustment circuit determines whether the control signal is at a level which causes the variable gain of the first component to be high, or is at a level which causes the variable gain to be low. If the control signal is at a level which causes the variable gain to be high, then the gain adjustment circuit sets the adjustable gain of the second component to a low level. In one embodiment, this is done by providing a proper adjustment signal to the second component. On the other hand, if the control signal is at a level which causes the variable gain to be low, then the gain adjustment circuit sets the adjustable gain of the second component to a high level. By making the gain of the second component low when the gain of the first component is high, and the gain of the second component high when the gain of the first component is low, the gain adjustment circuit maintains the overall gain of the components relatively constant. Thus, even though the gains of the individual components may vary greatly, the overall gain of the components does not. In this manner, the present invention maintains a relatively constant gain in a multi-component apparatus.

DETAILED DESCRIPTION OF EMBODIMENT(S)

Figure 3:
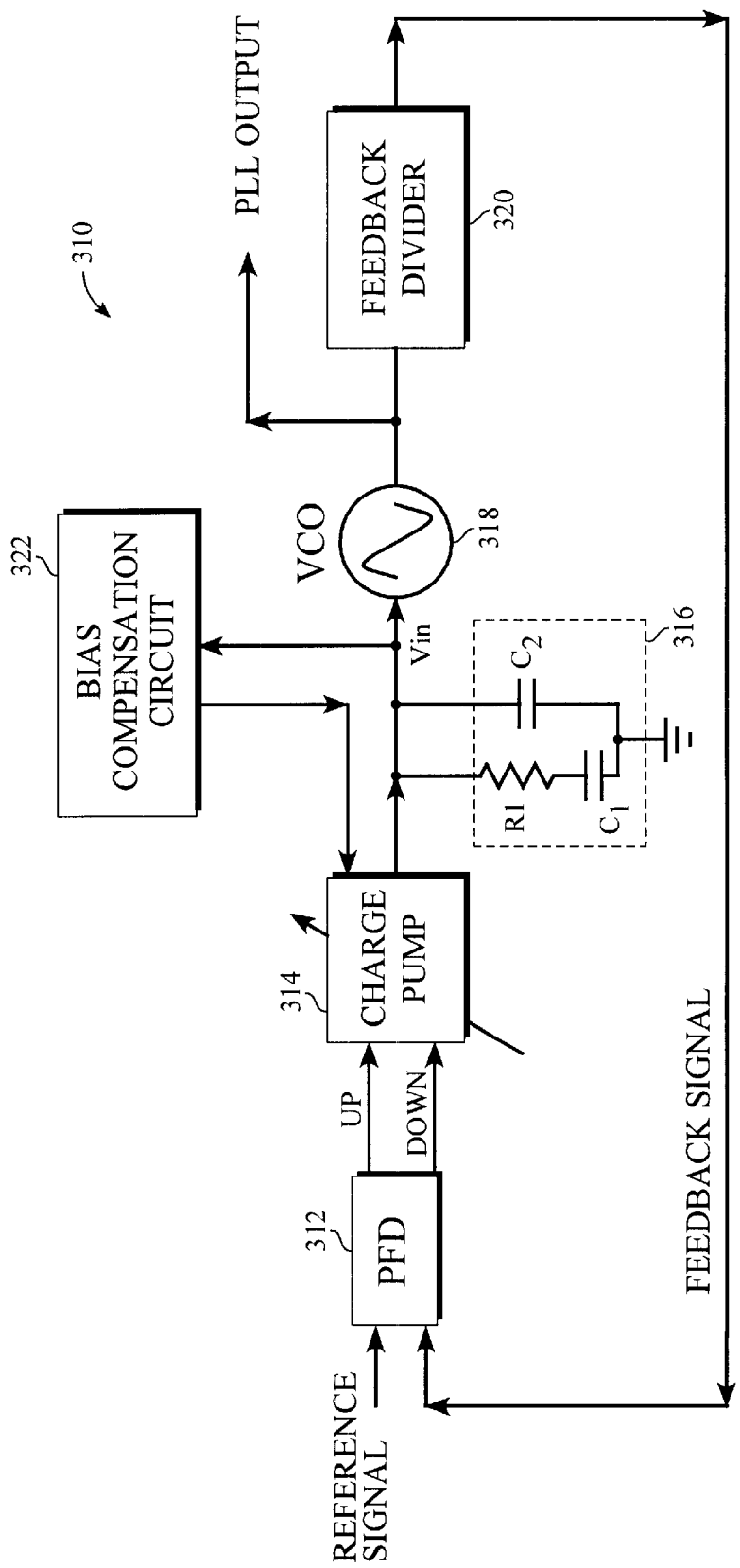
FIG. 3 is a functional block diagram of an apparatus in which one embodiment of the present invention may be implemented.

With reference to FIG. 3, there is shown an apparatus 310 in which one embodiment of the present invention may be implemented. For the sake of illustration, the invention will be described in the context of a phase locked loop (PLL) 310; however, it should be noted that the invention is not so limited. Rather, it may be applied generally to any apparatus in which it is desirable to maintain the overall gain of the apparatus at a relatively constant level.

As shown in FIG. 3, the PLL 310 comprises many of the components of a typical PLL, including a PFD 312, a charge pump 314, a loop filter 316, a VCO 318, and a feedback divider 320. In addition, PLL 310 further comprises a bias compensation circuit 322. As will be explained further below, it is the bias compensation circuit 322 that adjusts the gain of the charge pump 314 to maintain the overall gain of the PLL 310 at a relatively constant level.

More specifically, the bias compensation circuit 322 receives as input the control voltage Vin. This control voltage Vin is derived from the loop filter 316, and its voltage level is determined by the current sourced or sunk by the charge pump 314. Once derived, the control voltage Vin is applied both to the bias compensation circuit 322 and to the VCO 318 to cause the VCO 318 to generate a new PLL output signal. The frequency of the new PLL output signal is determined or controlled by the control voltage Vin. In one embodiment, the gain of the VCO 318 is not constant but rather varies with the level of the control voltage Vin. In such a case, the control voltage Vin determines not only the frequency of the PLL output signal but also the gain of the VCO 318. This will be discussed in greater detail below.

Based upon the control voltage Vin, the bias compensation circuit 322 generates a compensated bias current which is applied to the charge pump 314. The higher this compensated bias current, the more current the charge pump 314 sources or sinks. The more current the charge pump 314 sources or sinks, the greater the gain of the charge pump 314. Thus, the compensated bias current acts as a gain adjustment mechanism for adjusting the gain of the charge pump 314. Hence, the bias compensation circuit 322 may be viewed as a gain adjustment circuit, and the compensated bias current may be viewed as a gain adjustment signal.

Figure 1:
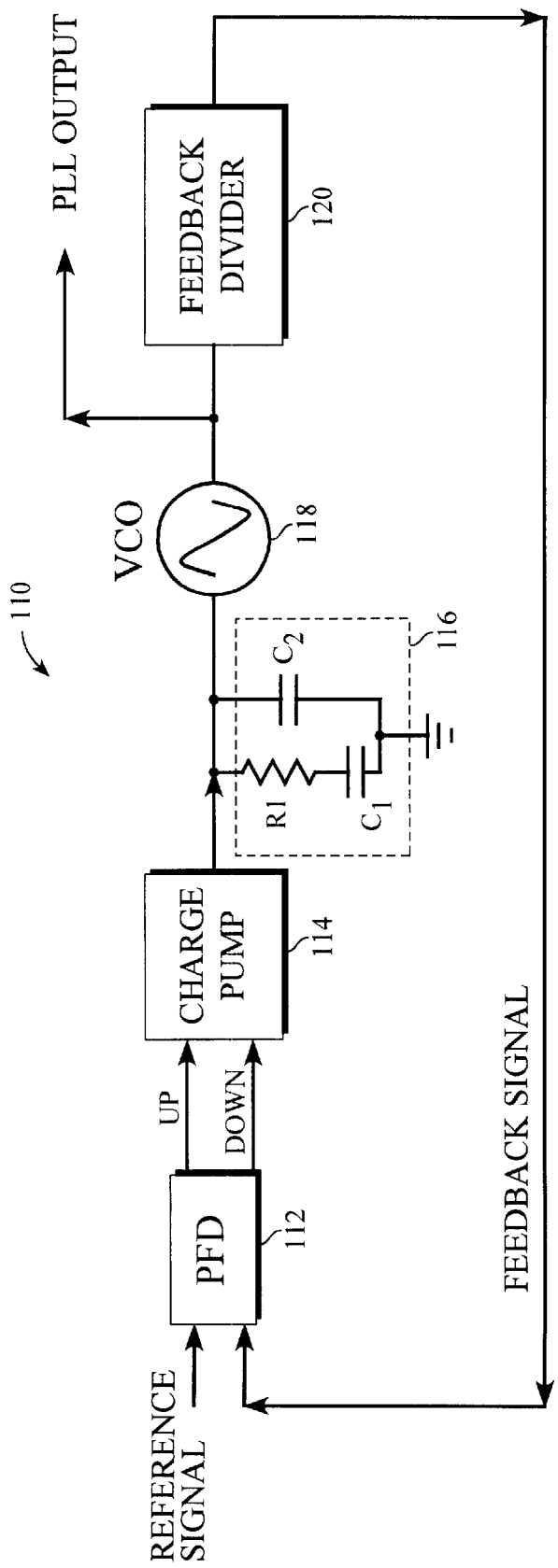
FIG. 1 is a functional block diagram of a typical phase locked loop.
Figure 2:
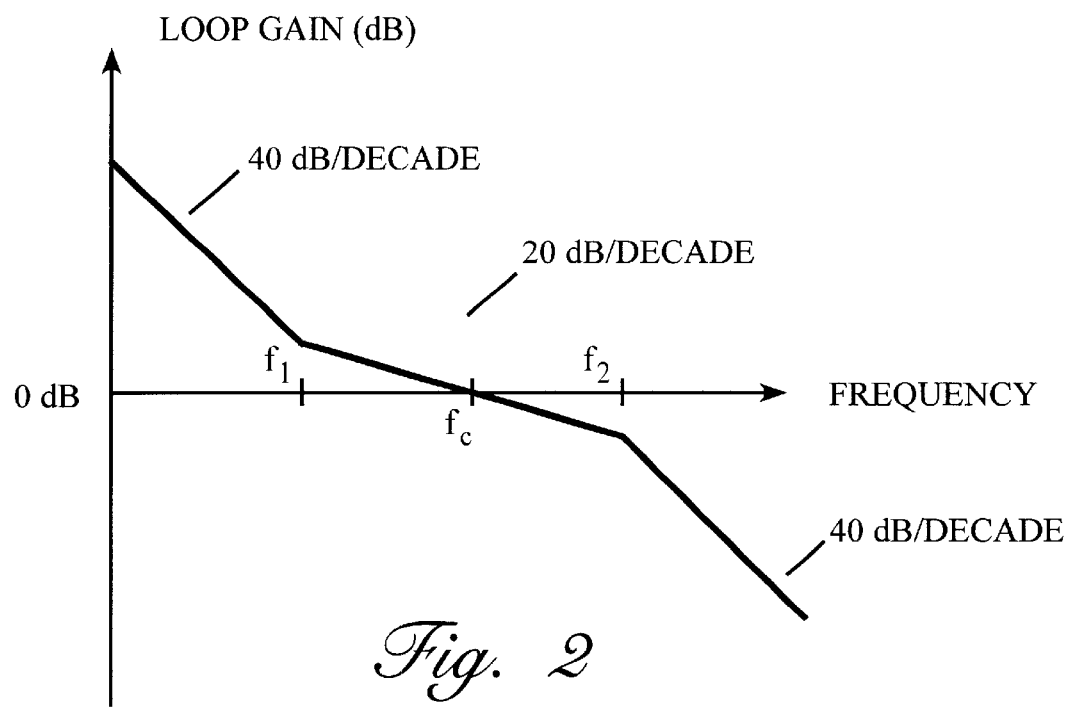
FIG. 2 is a loop gain vs. frequency plot for the phase locked loop of FIG. 1.
Figure 4:
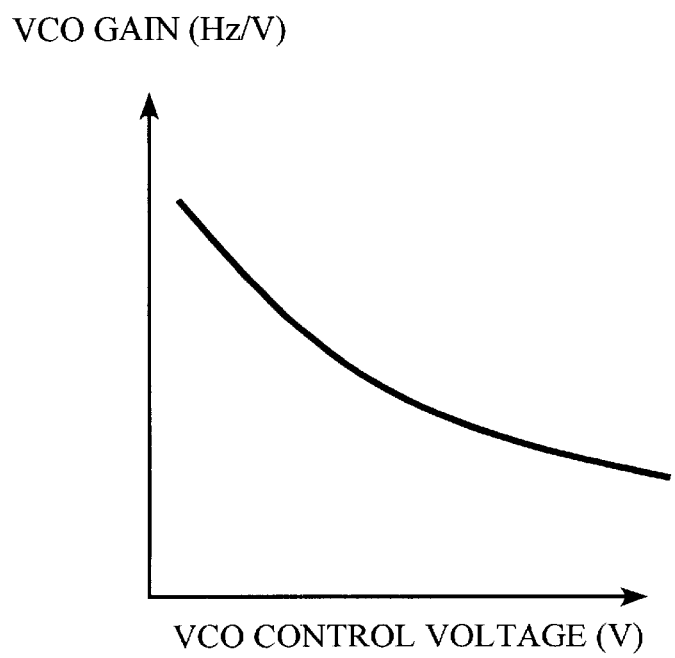
FIG. 4 is a gain vs. VCO control voltage plot for a variable gain VCO.

As mentioned above, the VCO 318 in one embodiment has a variable gain wherein the gain varies depending upon the level of the control voltage Vin. This may be the case, for example, where the VCO 318 is a varactor-tuned VCO. The gain plot for such a VCO is shown in FIG. 4. As FIG. 4 shows, the gain of the VCO 318 is not constant (i.e. is not a straight horizontal line). Rather, when the VCO control voltage is low, the gain of the VCO is high. When the VCO control voltage is high, the gain of the VCO is low. Since the gain of the VCO 318 varies with VCO control voltage, the overall gain of the PLL 310 will also vary with VCO control voltage unless the gain of another component in the PLL 310 is adjusted to compensate for this variation. In the embodiment shown in FIG. 3, the gain variation of the VCO 318 is compensated for by the bias compensation circuit 322 by adjusting the gain of the charge pump 314.

More specifically, the bias compensation circuit 322 determines the proper gain for the charge pump 314 based upon the control voltage Vin. If the control voltage Vin is at a level which causes the gain of the VCO 318 to be high, then the bias compensation circuit 322 outputs a small compensated bias current to set the gain of the charge pump 314 to low. On the other hand, if the control voltage Vin is at a level which causes the gain of the VCO 318 to be low, then the bias compensation circuit 322 outputs a relatively large compensated bias current to set the gain of the charge pump 314 to high. By making the gain of the charge pump 314 low when the gain of the VCO 318 is high, and the gain of the charge pump 314 high when the gain of the VCO 318 is low, the bias compensation circuit 322 maintains the overall gain of the PLL 310 at a relatively constant level. Thus, even though the gains of the individual components vary significantly, the overall gain of the PLL 310 does not. in this manner, the bias compensation circuit 322 maintains a relatively constant PLL gain.

At this point, it should be noted that according to one embodiment, the control voltage Vin shown is FIG. 3 is not the same as the VCO control voltage shown in FIG. 4. Rather the VCO control voltage is the differential between a supply voltage Vcc and the control voltage Vin. More specifically, a positive terminal of the VCO 318 is coupled to receive Vcc while a negative terminal is coupled to receive Vin. The VCO control voltage is the difference between these two signals, i.e. is equal to Vcc−Vin. Thus, as Vin increases, the VCO control voltage decreases, and as Vin decreases, the VCO control voltage increases. With this in mind, a specific embodiment of the bias compensation circuit 322 will now be described with reference to FIG. 5.

Figure 5:
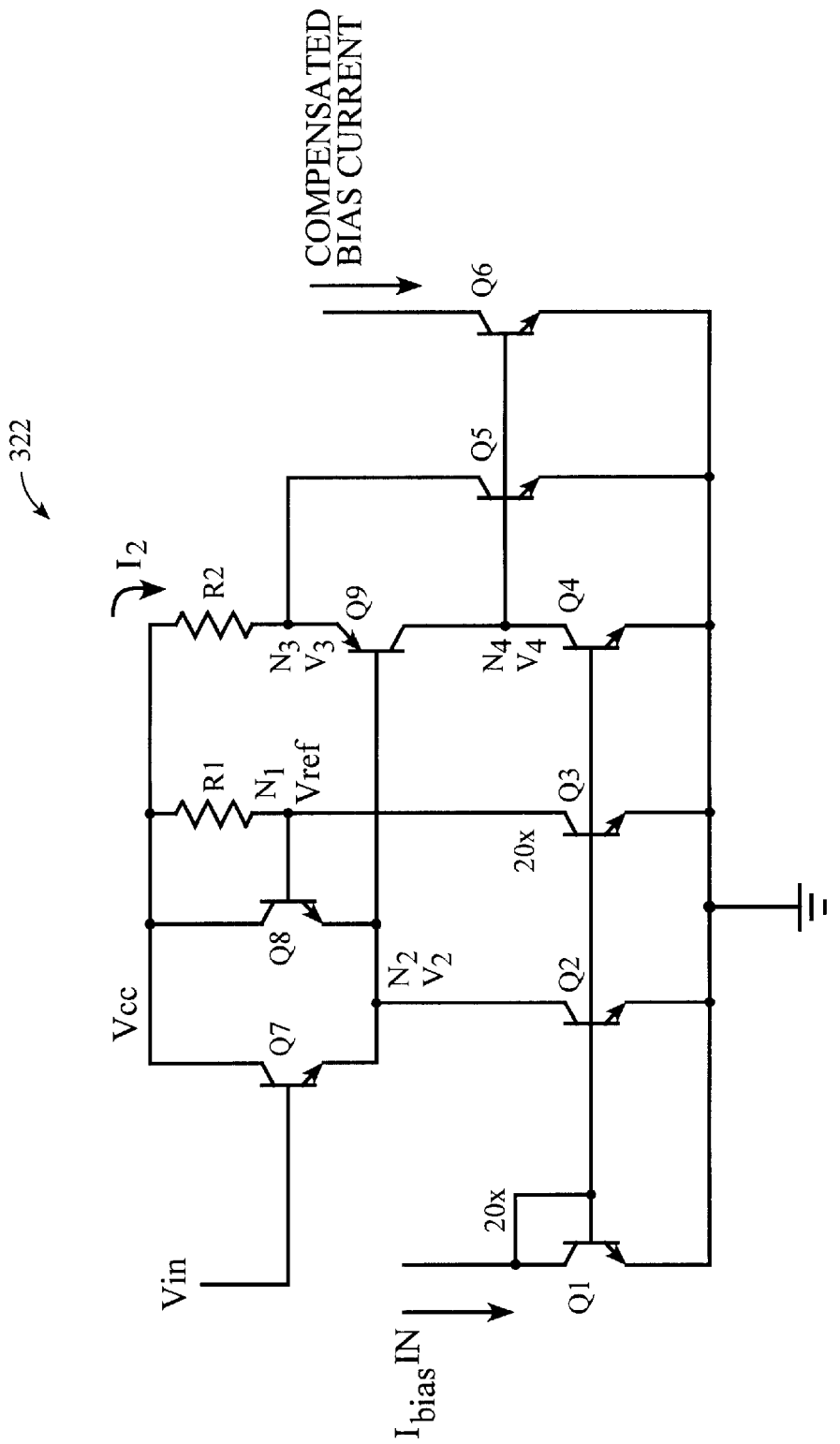
FIG. 5 is a detailed circuit diagram of one embodiment of the bias compensation circuit of FIG. 3.

As shown in FIG. 5, the bias compensation circuit 322 comprises a plurality of transistors and resistors. In one embodiment, the transistors take the form of bipolar junction transistors (BJT's). Most of the transistors are npn; however, there is one transistor Q9 which is pnp. As a matter of notation, the emitter terminal of each transistor is the terminal indicated by the arrow. If the arrow is pointing towards the body of the transistor, then the transistor is a pnp transistor. If the arrow is pointing away from the body, then the transistor is an npn transistor. Thus, for example, transistor Q9 is a pnp transistor having its emitter terminal coupled to node N3, and transistor Q4 is an npn transistor having its emitter terminal coupled to ground.

The bias compensation circuit 322 first comprises a transistor Q1 for receiving an input bias current IbiasIn at its collector terminal. The input bias current IbiasIn is a fixed current generated by a bias block (not shown) and provided to the bias compensation circuit 322 to facilitate operation of the circuit. Transistor Q1 has its collector coupled to its base, and its emitter coupled to ground. All of the input bias current IbiasIn flows from the collector to the emitter of Q1 (i.e. "flows through" Q1).

The base of transistor Q1 is coupled to the bases of transistors Q2, Q3, and Q4. Like transistor Q1, the emitters of transistors Q2, Q3, and Q4 are coupled to ground. Since the base and emitter voltages of transistors Q2, Q3 and Q4 are the same as the base and emitter voltages of transistor Q1, transistors Q2, Q3, and Q4 act as current mirrors. As a result, a replica of the current flowing through transistor Q1 flows through each of the transistors Q2, Q3, and Q4. In the embodiment shown in FIG. 5, transistor Q3 is the same size (20x) as Q1; thus, the current flowing through Q3 is the same as that flowing through Q1, namely, IbiasIn. Transistors Q2 and Q4, however, are one-twentieth the size of Q1. As a result, the current flowing through each transistor Q2, Q4 is one-twentieth the current flowing through Q1, namely, one-twentieth IbiasIn. These currents are constant; thus, transistors Q2, Q3, and Q4 act as current sources. At this point, it should be noted that the 20 to 1 size ratio given in this example is for illustrative purposes only. Other size ratios may be used without departing from the invention.

As noted above, transistor Q3 has a constant current of IbiasIn flowing through it. This current also flows through resistor R1. As a result, there is a voltage drop across resistor R1 equal to R1*IbiasIn, which means that the voltage at node N1 is equal to Vcc−R1*IbiasIn. This voltage is constant, and it is applied as a reference voltage Vref to the base of transistor Q8.

Transistors Q7 and Q8 are coupled together to form a differential pair. More specifically, the collectors of Q7 and Q8 are coupled to a supply voltage Vcc, while the emitters of Q7 and Q8 are coupled to the collector of transistor Q2 and the base of transistor Q9 to form node N2. The base of Q7 is coupled to receive the control voltage Vin, while the base of Q8 is coupled to node N1 to receive the reference voltage Vref. As noted previously, transistor Q2 has a constant current of one-twentieth IbiasIn flowing through it. This current flows through either Q7 or Q8. Which transistor it flows through depends upon the levels of Vin and Vref. If Vin is greater than Vref, then the current flows through Q7. If Vin is less than Vref, then the current flows through Q8. If the current flows through Q7, the voltage V2 at node N2 is one diode drop below Vin. If the current flows through Q8, then V2 is one diode drop below Vref. In a sense, the voltage V2 provides an indication as to the level of the control voltage Vin. When Vin is greater than Vref, voltage V2 tracks the control voltage Vin. Once Vin is less than Vref, voltage V2 remains constant at one diode drop below Vref, thereby indicating that the control voltage Vin has dropped below Vref. This indication provided by the voltage V2 is sensed and used to generate the compensated bias current provided to the charge pump 314.

The portion of the bias compensation circuit 322 responsible for generating the compensated bias current comprises transistors Q9, Q4, Q5, Q6, and resistor R2. Transistor Q9 has its base coupled to node N2 to receive voltage V2, its emitter coupled to resistor R2, and its collector coupled to the collector of Q4. Transistor Q5 has its collector coupled to the emitter of Q9, its base coupled to the collectors of Q9 and Q4, and its emitter coupled to ground. Like transistor Q5, transistor Q6 also has its base coupled to the collectors of Q9 and Q4, and its emitter coupled to ground. Configured in this manner, Q6 behaves as a current mirror; thus, a replica of the current flowing through Q5 flows through Q6. The collector of Q6 is coupled to the charge pump 314 to provide the compensated bias current to the charge pump 314.

Configured in the manner shown, transistor Q9 behaves as a voltage follower. This means that the voltage V3 at the emitter of Q9 follows the voltage V2 at the base of Q9. The relationship between V2 and V3 is that V3 is a diode drop above V2 (i.e. V3=V2+diode drop). That being the case, the voltage drop across R2 is Vcc−V2−diode drop, which means that the current I2 flowing through R2 is equal to (Vcc−V2−diode drop)/R2. Part of this current I2 flows through Q9 and the remainder flows through Q5. Recall that a fixed current of one-twentieth IbiasIn flows through Q4. Since all of the current flowing through Q9 also flows through Q4 (ignoring any base currents), the current flowing through Q9 is fixed at one-twentieth IbiasIn. As a result, any portion of current I2 above one-twentieth IbiasIn flows through Q5. The current flowing through Q5 is replicated by Q6, and it is this replicated current that is provided to the charge pump 314 as the compensated bias current. The larger this compensated bias current, the higher the gain of the charge pump 314. The compensated bias current is largest when the current I2 is largest.

Figure 6:
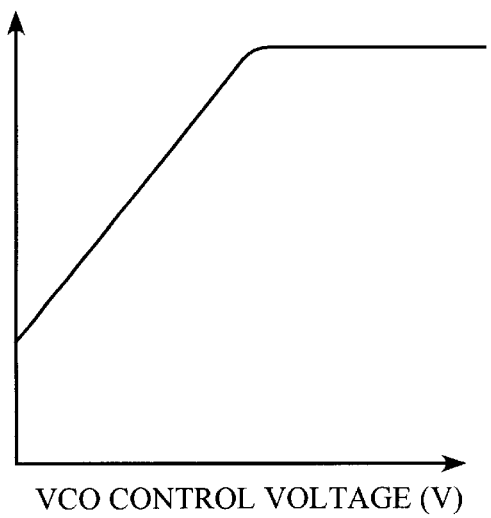
FIG. 6 is a gain vs. VCO control voltage plot for the charge pump of FIG. 3 after the gain of the charge pump has been adjusted by the compensated bias current provided by the bias compensation circuit of FIG. 3.

As noted above, the current I2 is equal to (Vcc−V2−diode drop)/R2. This current is largest when V2 is the smallest. V2 is smallest when the control voltage Vin is the smallest (note that V2 cannot fall below one diode drop below Vref). Thus, the smaller the control voltage Vin, the larger the compensated bias current and the higher the charge pump gain. Recall that the relationship between the control voltage Vin and the VCO control voltage is an inverse relationship. That is, the smaller the control voltage Vin, the larger the VCO control voltage, and the larger the control voltage Vin, the smaller the VCO control voltage. This being the case, the bias compensation circuit 322 causes the gain of the charge pump 314 to be high when the VCO control voltage is high. A plot of the resulting gain of the charge pump is shown in FIG. 6. As expected, the gain of the charge pump 314 increases as the VCO control voltage increases (until a plateau is reached). Notice that this is the opposite of the gain plot shown for the VCO 318 in FIG. 4. Since the gain oft he charge pump 314 is supposed to compensate for the variation in gain of the VCO 318, this is as it should be.

Figure 7:
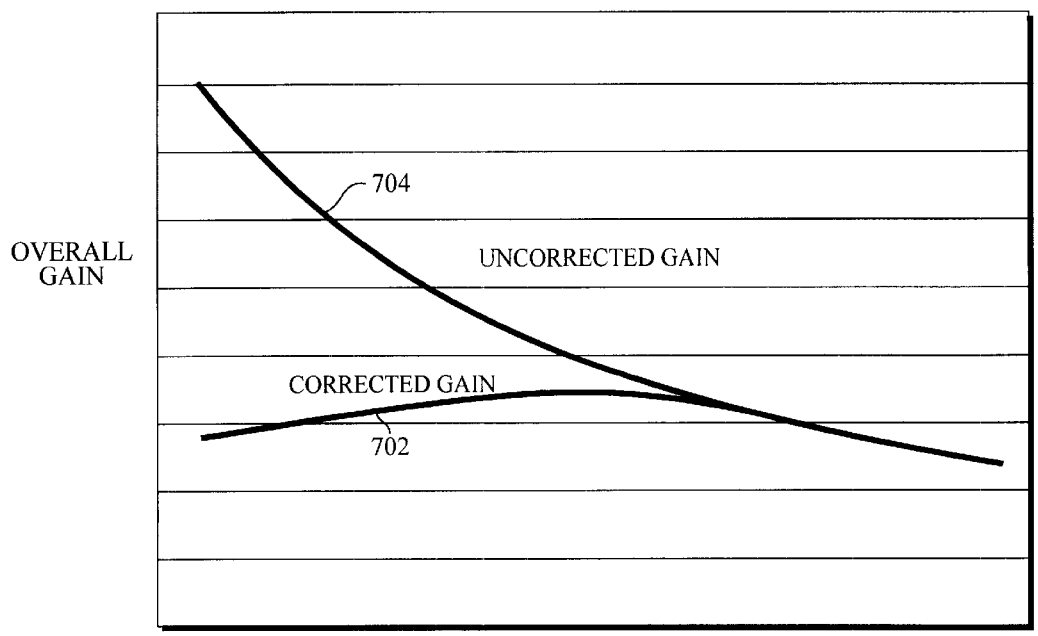
FIG. 7 is a gain vs. VCO control voltage plot for the overall gain of the charge pump and the VCO of FIG. 3 after the gain of the charge pump has been adjusted by the compensated bias current provided by the bias compensation circuit of FIG. 3.

The overall gain of the charge pump 314 and the VCO 318 is derived by multiplying the gain of the charge pump 314 with the gain of the VCO 318. Put another way, the overall gain of the charge pump 314 and the VCO 318 is the product of the gain plots of FIGS. 4 and 6. The resulting gain curve is shown in FIG. 7 as the corrected gain curve 702. As can be seen, this gain curve 702 is relatively horizontal, meaning that the overall gain is relatively constant. Compared with the uncorrected gain curve 704 which represents what the overall gain would have been had the invention not been implemented, the corrected gain curve 702 is a marked improvement. Thus, even in the face of a variable gain component, the present invention is able to maintain a relatively constant overall gain.

At this point, it should be noted that although the invention has been described with reference to specific embodiments, it should not be construed to be so limited. Various modifications can be made by those of ordinary skill in the art with the benefit of this disclosure without departing from the spirit of the invention. Thus, the invention should not be limited by the specific embodiments used to illustrate it but only by the scope of the appended claims.

What is claimed is:

1. An apparatus, comprising:
    a first component having an input coupled to receive a voltage control signal, said first component having a variable gain which varies depending upon said voltage control signal;
    a second component having an output for providing an output signal which affects said voltage control signal, said second component having an adjustable gain; and
    a gain adjustment circuit having an input coupled to receive said voltage control signal and an output coupled to said second component, said gain adjustment circuit performing a comparison of said voltage control signal with a reference voltage signal, and adjusting said adjustable gain based upon a result of said comparison to maintain an overall gain of said first and second components at a relatively constant level.

2. The apparatus of claim 1, wherein said gain adjustment circuit sets said adjustable gain to a low level if said voltage control signal is at a level which causes said variable gain to be high.

3. The apparatus of claim 1, wherein said gain adjustment circuit sets said adjustable gain to a high level if said voltage control signal is at a level which causes said variable gain to be low.

4. The apparatus of claim 1, wherein said first component comprises a voltage controlled oscillator and said second component comprises a charge pump.

5. The apparatus of claim 4, wherein said apparatus is a phase locked loop.

6. The apparatus of claim 4, wherein said voltage controlled oscillator comprises a varactor.

7. The apparatus of claim 4, wherein said gain adjustment circuit is a bias compensation circuit which provides a bias signal applied to said charge pump.

8. The apparatus of claim 7, wherein said charge pump provides an output current, and wherein said bias signal controls the magnitude of said output current.

9. The apparatus of claim 8, wherein said bias signal comprises a bias current, and wherein a higher bias current causes said charge pump to provide a higher output current.

10. The apparatus of claim 8, wherein said bias signal comprises a bias current, and wherein said bias compensation circuit comprises:
    an indication circuit having an input coupled to receive said voltage control signal, and an output for providing an indication signal, said indication signal providing an indication as to the level of said voltage control signal; and
    a bias current generation circuit coupled to receive said indication signal, said bias current generation circuit generating said bias current based upon said indication signal.

11. The apparatus of claim 10, wherein said indication circuit generates said indication signal by comparing said voltage control signal with said reference voltage signal.

12. The apparatus of claim 11, wherein said bias compensation circuit further comprises:
    a reference signal generation circuit for generating said reference voltage signal.

13. In an apparatus comprising a first component and a second component, the first component having a variable gain which depends upon an input voltage control signal, and the second component having an adjustable gain and providing an output signal which affects the input voltage control signal, a gain adjustment circuit for maintaining an overall gain of the first and second components at a relatively constant level, comprising:
    an indication circuit having an input coupled to receive the input voltage control signal, and an output for providing an indication signal, said indication signal providing an indication as to the level of the input voltage control signal; said indication circuit generating said indication signal by comparing the input voltage control signal with a reference voltage signal; and
    a signal generation circuit coupled to receive said indication signal, said signal generation circuit generating an adjustment signal based upon said indication signal, and applying said adjustment signal to the second component to set the adjustable gain of the second component such that the overall gain of the first and second components is maintained at a relatively constant level.

14. The gain adjustment circuit of claim 13, wherein said signal generation circuit sets the adjustable gain to a low level if the input voltage control signal is at a level which causes the variable gain to be high.

15. The gain adjustment circuit of claim 13, wherein said signal generation circuit sets the adjustable gain to a high level if the input voltage control signal is at a level which causes the variable gain to be low.

16. The apparatus of claim 13, wherein the first component comprises a voltage controlled oscillator and the second component comprises a charge pump, wherein said gain adjustment circuit is a bias compensation circuit, and wherein said adjustment signal is a bias signal applied to the charge pump.

17. The gain adjustment circuit of claim 16, wherein the charge pump provides an output current, and wherein said bias signal controls the magnitude of the output current.

18. The gain adjustment circuit of claim 17, wherein said bias signal comprises a bias current, and wherein a higher bias current causes the charge pump to provide a higher output current.

19. The gain adjustment circuit of claim 13, further comprising:
    a reference signal generation circuit for generating said reference voltage signal.

* * * * *